US009543856B2

(12) United States Patent
Suzuki

(10) Patent No.: US 9,543,856 B2
(45) Date of Patent: Jan. 10, 2017

(54) POWER CONVERSION APPARATUS HAVING A NEGATIVE TERMINAL OF A POWER SUPPLY CONNECTED TO ONE OF CONNECTION NODES OF A NEGATIVE SIDE BUS WITH U-PHASE, V-PHASE AND W-PHASE LOWER-ARM SWITCHING ELEMENTS EXCEPT THE END-SIDE ONES

(71) Applicant: DENSO CORPORATION, Kariya, Aichi-pref. (JP)

(72) Inventor: Tomotaka Suzuki, Nagoya (JP)

(73) Assignee: DENSO CORPORATION, Kariya (JP)

(*) Notice: Subject to any disclaimer, the term of this patent is extended or adjusted under 35 U.S.C. 154(b) by 165 days.

(21) Appl. No.: 14/279,896

(22) Filed: May 16, 2014

(65) Prior Publication Data

US 2014/0340948 A1    Nov. 20, 2014

(30) Foreign Application Priority Data

May 17, 2013    (JP) .................................. 2013-105564

(51) Int. Cl.
*H02M 7/537*    (2006.01)
*H02M 7/538*    (2007.01)
(Continued)

(52) U.S. Cl.
CPC ............. *H02M 7/537* (2013.01); *H02M 7/538* (2013.01); *H03K 17/567* (2013.01);
(Continued)

(58) Field of Classification Search
CPC ...... H02M 7/493; H02M 7/537; H02M 7/538; H02M 7/5387; H02M 1/08; H02M 1/084; H02M 1/088; H03K 17/567; H03K 17/691
(Continued)

(56) References Cited

U.S. PATENT DOCUMENTS

| | | | |
|---|---|---|---|
| 2009/0015185 A1* | 1/2009 | Yoshida | B60K 6/26 318/504 |
| 2010/0214055 A1* | 8/2010 | Fuji | B60L 3/00 340/3.1 |

(Continued)

FOREIGN PATENT DOCUMENTS

| | | |
|---|---|---|
| JP | 2007-312523 | 11/2007 |
| JP | 2008-061290 | 3/2008 |
| JP | 2011-244519 | 12/2011 |

OTHER PUBLICATIONS

Office Action (2 pgs.) dated Apr. 21, 2015 issued in corresponding Japanese Application No. 2013-105564 with an at least partial English-language translation thereof (3 pgs.).

*Primary Examiner* — Jessica Han
*Assistant Examiner* — David A. Singh
(74) *Attorney, Agent, or Firm* — Nixon & Vanderhye P.C.

(57) ABSTRACT

A power conversion apparatus has a structure in which the negative terminal of an insulated power supply is connected to one of connection nodes of a negative side bus with U-phase, V-phase and W-phase lower-arm switching elements except the end-side ones. That is the negative terminal of the insulated power supply is connected to the connection node between the negative side bus and the V-phase lower arm switching element to enable suppressing variations of input voltages supplied from the insulated power supply to respective drive circuits for driving the lower-arm switching elements by using low pass filters having smaller filtering capacity and smaller size.

7 Claims, 11 Drawing Sheets

(51) Int. Cl.
*H03K 17/567* (2006.01)
*H03K 17/691* (2006.01)
*H02M 1/08* (2006.01)
*H02M 7/493* (2007.01)

(52) U.S. Cl.
CPC ............ *H03K 17/691* (2013.01); *H02M 1/08* (2013.01); *H02M 7/493* (2013.01)

(58) Field of Classification Search
USPC .............................................. 363/13, 39–40
See application file for complete search history.

(56) References Cited

U.S. PATENT DOCUMENTS

| | | | | |
|---|---|---|---|---|
| 2010/0244558 A1* | 9/2010 | Mitsutani | ............... | B60K 6/365 307/9.1 |
| 2010/0283337 A1* | 11/2010 | Omiya | .................. | H02K 11/30 310/64 |
| 2011/0199800 A1* | 8/2011 | Yahata | .................. | H02M 7/003 363/131 |
| 2011/0278918 A1 | 11/2011 | Shindo et al. | | |
| 2012/0063187 A1* | 3/2012 | Sato | .................... | H02M 3/3374 363/131 |
| 2012/0212160 A1* | 8/2012 | Shindo | .................. | B60L 3/0007 318/139 |
| 2012/0230070 A1* | 9/2012 | Chen | ....................... | H02M 1/15 363/56.02 |
| 2012/0300522 A1* | 11/2012 | Tokuyama | ............ | H01L 25/072 363/131 |
| 2014/0049215 A1* | 2/2014 | Fassnacht | ........... | B60L 11/1814 320/109 |
| 2014/0133199 A1* | 5/2014 | Matsuo | ..................... | B60L 7/14 363/40 |
| 2015/0189784 A1* | 7/2015 | Hirano | .................. | H01L 25/072 361/728 |
| 2015/0340966 A1* | 11/2015 | Mutsuura | ............ | H02M 7/5387 363/98 |

* cited by examiner

US 9,543,856 B2

POWER CONVERSION APPARATUS HAVING A NEGATIVE TERMINAL OF A POWER SUPPLY CONNECTED TO ONE OF CONNECTION NODES OF A NEGATIVE SIDE BUS WITH U-PHASE, V-PHASE AND W-PHASE LOWER-ARM SWITCHING ELEMENTS EXCEPT THE END-SIDE ONES

This application claims priority to Japanese Patent Application No. 2013-105564 filed on May 17, 2013, the entire contents of which are hereby incorporated by reference.

BACKGROUND OF THE INVENTION

1. Field of the Invention

The present invention relates to a power conversion apparatus including a plurality of series connections each having a high-voltage side switching element and a low-voltage side switching element connected in series to each other, a common negative side bus to which one end of each of the low-voltage side switching elements is connected, the other ends of the low-voltage side switching elements being connected to the corresponding high-voltage side switching elements, drive circuits provided for the respective low-voltage side switching elements for driving the low-voltage side switching elements, and a common power supply to which the drive circuits are connected.

2. Description of Related Art

Japanese Patent Application Laid-open No. 2008-61290 describes, as such a power conversion apparatus, a three-phase inverter having a structure in which the grounds of the drive circuits corresponding to the low-voltage side switching elements (IGBTs) of U, V and W phases are used as the negative side bus. This three-phase inverter includes low pass filters (LC filters) interposed between each of the drive circuits and the power supply.

The LC filters are provided for suppressing variation of the ground voltage of each of the drive circuits due to voltage drop in the negative side bus caused by a current flowing through the negative side bus. Suppressing variation of the ground voltage makes it possible to suppress variation of the input voltage applied to the drive circuits from the power supply.

By the provision of such LC filters, variation of the ground voltage can be suppressed for each of drive circuits respectively corresponding to the three phases. However, when the three-phase inverter employs a structure in which, of three connection nodes of the negative side bus with the three low-voltage side switching elements, the nodes not in the middle in the direction along the negative side bus are connected with the negative terminal of the power supply, the following problem arises.

The voltage difference between the connection node connected with the negative terminal of the power supply and each of the other two connection nodes may increase with the increase of the inductance between the connection node connected with the negative terminal of the power supply and each of the other two connection nodes. Accordingly, when one of the three connection nodes which is not in the middle forms a reference point, variation of the input voltage of the drive circuit whose ground is at one of the connection nodes which is most distant from the reference point may be considerably large.

It would be possible to suppress the variation of the input voltage by increasing the filtering capacity of the LC filter interposed between the drive circuit and the power source, for example by lowering its resonance frequency. However, in this case, the size and cost of the LC filter are likely to be increased.

SUMMARY

An exemplary embodiment provides a power conversion apparatus including:

series connections each including a low-voltage side switching element having first and second ends and a high-voltage side switching element connected to the first end of the low-voltage side switching element;

a negative side bus to which the second ends of the low-voltage side switching elements are connected;

drive circuits provided respectively for the low-voltage side switching elements for respectively driving the low-voltage side switching elements; and a power supply connected to the drive circuits;

wherein a ground voltage of each of the drive circuits is a voltage of the second end of a corresponding one of the low-voltage side switching elements, the negative side bus has an elongated shape, the low-voltage side switching elements are arranged along a direction in which the negative side bus extends to be connected to the negative side bus, a negative terminal of the power supply is connected to one of connection nodes of the negative side bus with the low-voltage side switching elements except the connection node closest to an extreme end of the negative side bus, and a low pass filter is interposed between the power supply and each of the drive circuits except the drive circuit corresponding to the low-voltage side switching element connected with the negative terminal of the power supply.

According to the exemplary embodiment, there is provided a power conversion apparatus capable of sufficiently reducing variations of input voltages applied to its drive circuits for driving its switching elements using low pass filters having smaller filtering capacity and smaller size.

Other advantages and features of the invention will become apparent from the following description including the drawings and claims.

PREFERRED EMBODIMENTS OF THE INVENTION

First Embodiment

Figure 1:
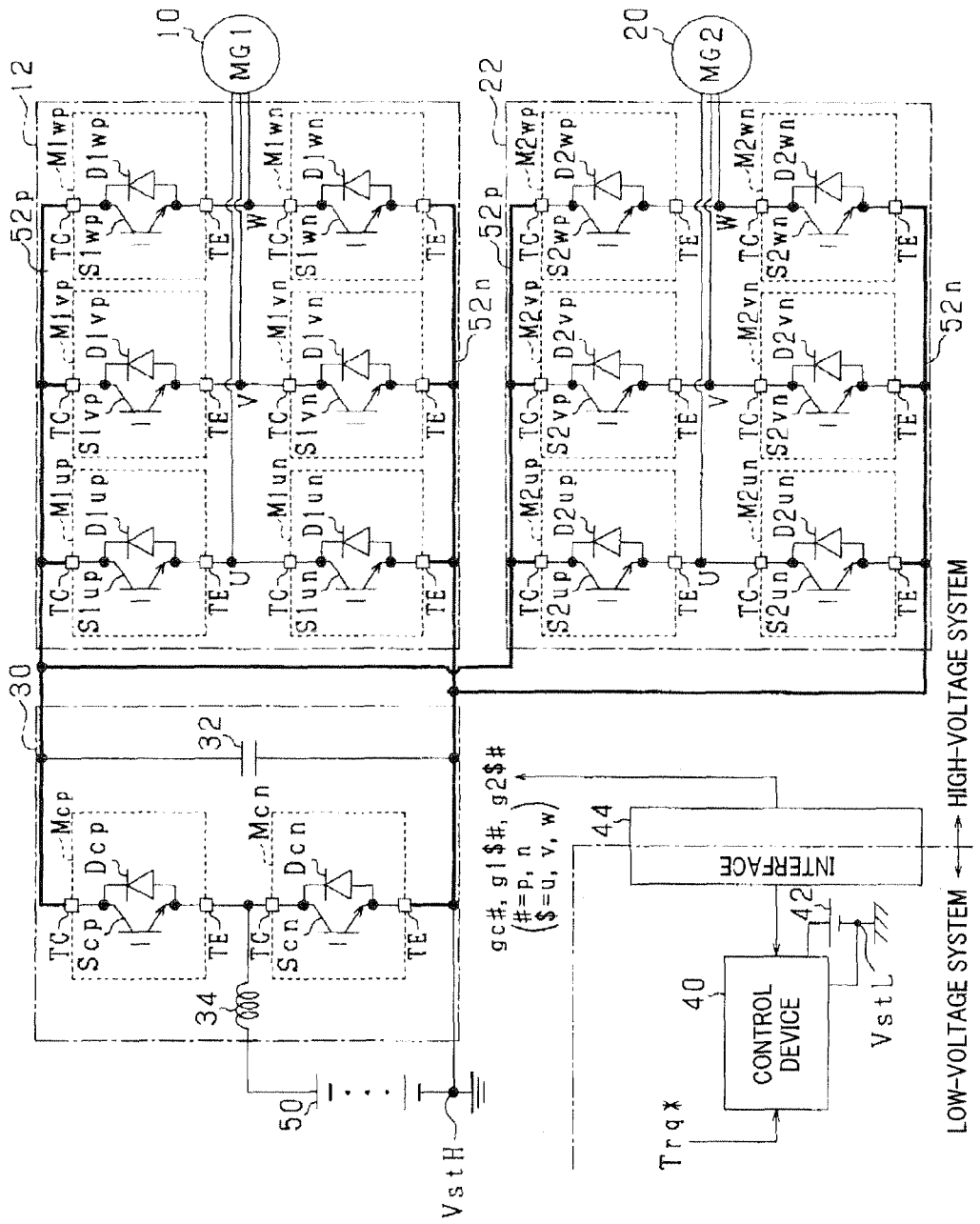
FIG. 1 is a diagram showing an overall structure of a motor control system including a power conversion apparatus according to a first embodiment of the invention.

FIG. 1 is a diagram showing an overall structure of a motor control system including a power conversion apparatus according to a first embodiment of the invention. The motor control system is used for a hybrid vehicle on which electric rotating machines and an internal combustion engine are mounted as a vehicle main engine.

As shown in FIG. 1, the motor control system includes a first motor-generator 10, a second motor-generator 20, a first inverter device 12, a second inverter device 22, a step-up converter device 30 and a control device 40. The first and second motor-generators 10 and 20 are coupled to drive wheels and the internal combustion engine through a not-shown power split device. The first motor-generator 10 is connected to the first inverter device 12 to act as part of the vehicle main engine. The second motor-generator 20 is connected to the second inverter device 22 to act as a starter for providing initial rotation to the crankshaft of the internal combustion engine or a generator for supplying electric power to various vehicle-mounted electric or electronic devices. The first and second inverter devices 12 and 22 are a three-phase inverter device connected to a high-voltage battery 50 (a rechargeable lithium ion battery or a rechargeable nickel hydrogen battery, for example) through the step-up converter device 30.

The step-up converter device 30 includes a capacitor 32, a reactor 34, an upper-arm step-up switching element Scp and a lower-arm step-up switching element Scn. These step-up switching elements Scp and Scn are connected in series to each other. The series connection of the upper-arm step-up switching element Scp and a lower-arm step-up switching element Scn is parallel connected with the capacitor 32. The connection node of the series connection is connected to the positive terminal of the high-voltage battery 50 through the reactor 34. The step-up converter device 30 functions as a DC power supply which steps up the output voltage (288 V, for example) of the high-voltage battery 50 up to a predetermined voltage (650 V, for example) by opening and closing the step-up switching elements Scp and Scn.

The first inverter device 12 includes three series connections, that is, series connections of $-phase upper-arm switching elements S1$p ($=u,v,w) as first upper-arm switching elements and $-phase lower-arm switching elements S1$n ($=u,v,w) as first lower-arm switching elements. The connection node between the first $-phase upper-arm switching element S1$p and the first $-phase lower-arm switching element S1$n is connected to the $-phase of the first motor-generator 10.

The second inverter device 22 includes three series connections, that is, series connections of $-phase upper-arm switching elements S2$p ($=u,v,w) as second upper-arm switching elements and $-phase lower-arm switching elements S2$n ($=u,v,w) as second lower-arm switching elements. The connection node between the second $-phase upper-arm switching element S2$p and the second $-phase lower-arm switching element S2$n is connected to the $-phase of the second motor-generator 20.

In this embodiment, a voltage-controlled type semiconductor switching element (IGET, for example) is used as the above switching elements Sc#,S1$# and S2$# (#=p,n). The switching elements Sc#,S1$# and S2$# are inversely parallel-connected with freewheel diodes Dc#,D1$# and D2$#, respectively.

Each of the upper-arm step-up switching element Scp, the first $-phase upper-arm switching element S1$p and the second $-phase upper-arm switching element S2$p functions as a high-voltage side switching element. Each of the lower-arm step-up switching element Scn, the first $-phase lower-arm switching element S1$n and the second $-phase lower-arm switching element S2$n functions as a low-voltage side switching element.

Figure 2:
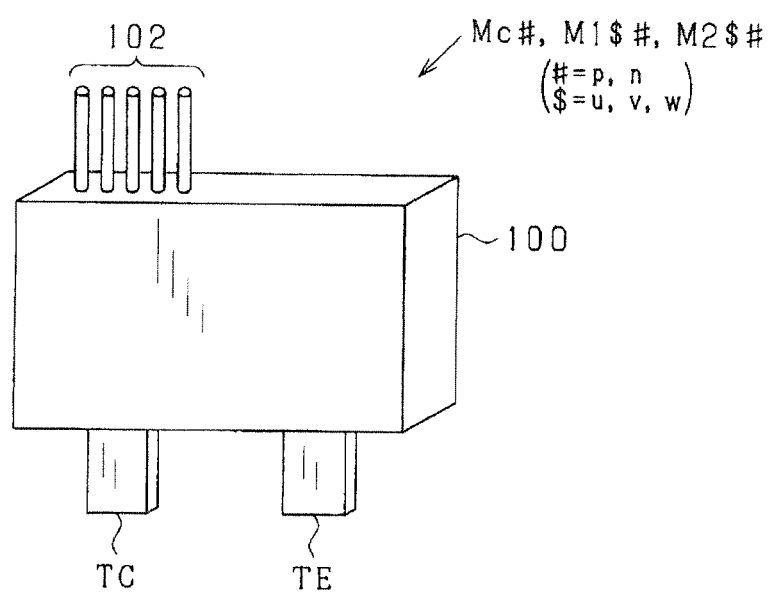
FIG. 2 is a perspective view of one of semiconductor modules included in the power conversion apparatus according to the first embodiment of the invention.

As shown in FIG. 2, the switching elements Sc#, S1$# and S2$# and the freewheel diodes Dc#, D1$# and D2$# are modularized (formed as modules). In this embodiment, a component in which the upper-arm step-up switching element Scp (or the lower-arm step-up switching element Scn) and the freewheel diode Dcp (or Dcn) are modularized is referred to as the upper-arm step-up module Mcp (or a lower-arm step-up module Mcn). Further, a component in which the first $-phase upper-arm switching element S1$p (or the first $-phase lower-arm switching element S1$n) and the freewheel diode D1$p (or D1$n) inversely parallel-connected thereto is referred to as the first $-phase upper-arm module M1$p (or the first $-phase lower-arm module M1$n). Further, a component in which the second $-phase upper-arm switching element S2$p (or the second $-phase lower-arm switching element S2$n) and the freewheel diode D2$p (or D2$n) inversely parallel-connected thereto is referred to as the second $-phase upper-arm module M2$p (or the second $-phase lower-arm module M2$n).

The structure of the above modules is explained below taking the first $-phase upper-arm module M1$p as an example. The first $-phase upper-arm module M1$p includes a main body 100 incorporating the first $-phase upper-arm switching element S1$p and the freewheel diode D1$p, a plurality of control terminals 102 projecting from the main body 100 and a pair of power terminals projecting from the main body 100. The plurality of the control terminals 102 include a terminal short-circuited to the gate of the first $-phase upper-arm switching element S1$p. One of the pair of the power terminals is a collector terminal TC short-circuited to the collector of the first $-phase upper-arm switching element S1$p, and the other is an emitter terminal TE short-circuited to the emitter of the first $-phase upper-arm switching element S1$p.

The main body 100 has a flat rectangular shape. The plurality of the control terminals 102 are formed so as to project from a first surface of the main body 100, and the collector terminal TC and the emitter terminal TE are formed so as to project from a second surface opposite to the first surface.

Returning to FIG. 1, the collector terminals TC of the upper-arm step-up module Mcp, the first $-phase upper-arm module M1$p and the second $-phase upper-arm module M2$p are connected to one another through a common positive-side bus bar 52$p$. The emitter terminals TE of the lower-arm step-up module Mcn, the first $-phase lower-arm module M1$n and the second $-phase lower-arm module M2$n are connected to one another through a common negative side bus bar 52$n$. The negative side bus bar 52$n$ is connected to the negative terminal of the high-voltage battery 50.

The emitter terminal TE of the first $-phase upper-arm module M1$p is connected to the collector terminal TC of the first $-phase lower-arm module M1$n. The connection node between the emitter terminal TE of the first$-phase upper-arm module M1$p and the collector terminal TC of the first $-phase lower-arm module M1$n is connected to the $-phase of the first motor-generator 10.

The emitter terminal TE of the second $-phase upper-arm module M2$p is connected to the collector terminal TC of the second $-phase lower-arm module M2$n. The connection node between the emitter terminal TE of the second $-phase upper-arm module M2$p and the collector terminal TC of the second $-phase lower-arm module M2$n is connected to the $-phase of the second motor-generator 10. The emitter terminal TE of the upper-arm step-up module Mcp is connected to the collector terminal TC of the lower-arm step-up module Mcn.

Figure 3:
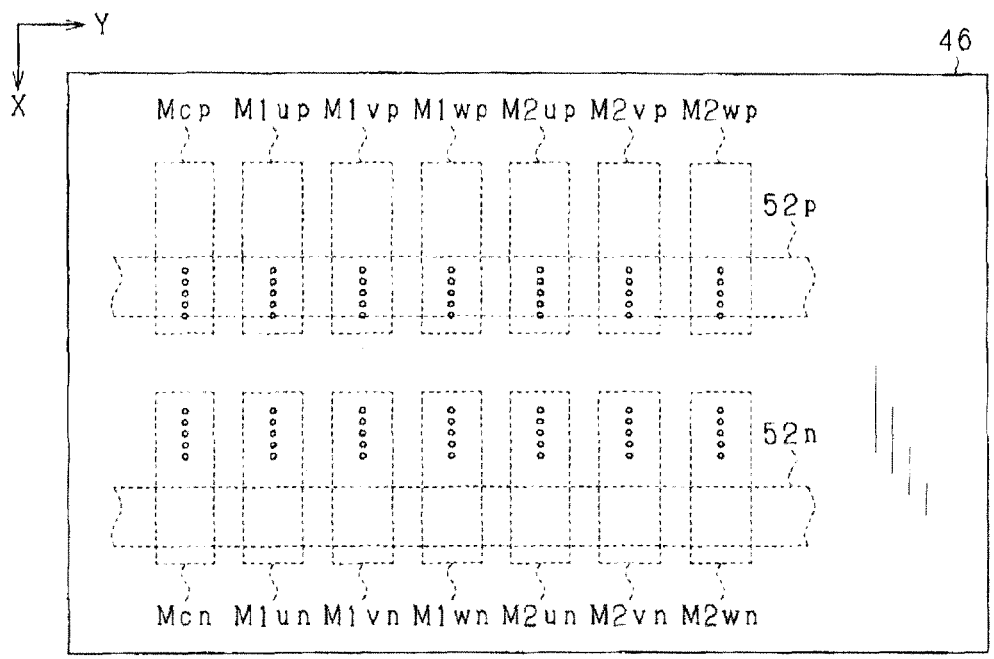
FIG. 3 is a plan view of a control circuit board on which the semiconductor modules are mounted.
Figure 4:
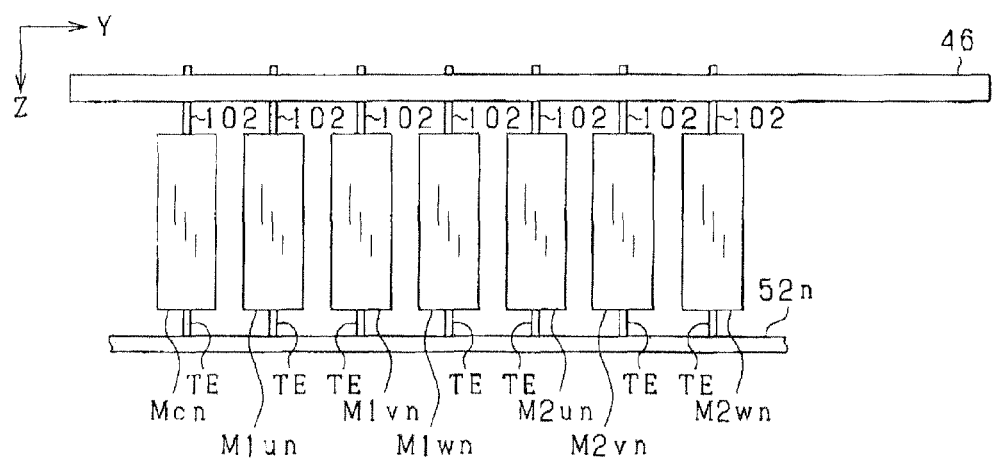
FIG. 4 is a side view of FIG. 3.

Next, the arrangement of the above described modules are explained with reference to FIGS. 3 and 4. FIG. 3 is a plan view of a control circuit board 46 on which the respective modules are mounted. FIG. 4 is a side view of FIG. 3. Here, the thickness direction of the control circuit board 46 is defined as a Z-direction, and the directions orthogonal to each other and parallel to the board surface of the control circuit board 46 are defined as an X-direction and a Y-direction.

As shown in FIGS. 3 and 4, the control circuit board 46 which has a rectangular shape, is disposed in a not-shown housing of the power conversion apparatus together with the respective modules, the positive-side bus bar 52$p$ and the negative side bus bar 52$n$. Each of the upper-arm step-up module Mcp, the first U-phase, V-phase and W-phase upper-arm modules M1up, M1vp and M1wp, and the second U-phase, V-phase and W-phase upper-arm modules M2up, M2vp and M2wp are mounted on the control circuit board 46 through the control terminals 102. More specifically, the upper-arm step-up module Mcp, the first U-phase, V-phase and W-phase upper-arm modules M1up, M1vp and M1wp, and the second U-phase, V-phase and W-phase upper-arm modules M2up, M2vp and M2wp are mounted on the control circuit board 46 through the control terminals 102 so as to be arranged in a row along the Y-direction in this order when viewed from the direction perpendicular to the plate surface of the control circuit board 46.

Further, the lower-arm step-up module Mcn, the first U-phase, V-phase and W-phase lower-arm modules M1un, M1vn and M1wn, and the second U-phase, V-phase and W-phase lower-arm modules M2un, M2vn and M2wn are mounted on the control circuit board 46 through the control terminals 102 so as to be arranged in a row along the Y-direction in this order when viewed from the direction perpendicular to the plate surface of the control circuit board 46. In this embodiment, the row of the upper-arm step-up module Mcp, the first upper-arm modules M1up, M1vp and M1wp and the second upper-arm modules M2up, M2vp and M2wp, and the row of the lower-arm step-up module Mcn, the first lower-arm modules M1un, M1vn and M1wn and the second lower-arm modules M2un, M2vn and M2wn are arranged side-by-side in parallel. Although not shown, a cooling device is provided between each adjacent two of the modules.

The upper-arm step-up module Mcp, the first U-phase, V-phase and W-phase upper-arm modules M1up, M1vp and M1wp and the second U-phase, V-phase and W-phase upper-arm modules M2up, M2vp and M2wp are respectively connected to one another through the positive-side bus bar 52$p$ having an elongated plate shape. The positive-side bus bar 52$p$ is a conductive member having a straight portion. These modules Mcp, M1up, M1, M1, M2up, M2vp and M2wp are arranged along the direction in which the positive-side bus bar 52$p$ extends, and connected to the positive-side bus bar 52$p$.

On the other hand, the lower-arm step-up module Mcn, the first lower-arm modules M1un, M1vn and M1wn and the second lower-arm modules M2un, M2vn and M2wn are respectively connected to one another through the negative side bus bar 52$p$ having a elongated plate shape. The negative side bus bar 52$n$ is a conductive member having a straight portion. These modules Mcn, M1un, M1vn, M1wn, M2un, M2vn and M2wn are arranged along the direction in which the negative side bus bar 52$n$ extends, and connected to the negative side bus bar 52$n$.

Each of the positive-side bus bar 52$p$ and the negative side bus bar 52$n$ may be formed of a single conductive member or a plurality of conductive members.

Returning to FIG. 1, the control device 40 is mainly constituted of a microcomputer powered by a low-voltage battery 42. The control device 40 manipulates the first and second inverter devices 12 and 22, and the step-up converter device 30 so that control variables (torques) of the first and second inverter devices 12 and 22 are controlled to their command values (referred to as the "command torque Trq*" hereinafter). More specifically, the control device 40 generates manipulation signals g1$#, and outputs them to the drive circuits of the switching elements S1$# to turn on and of the switching elements S1$# constituting the first inverter device 12. Further, the control device 40 generates manipulation signals g2$#, and outputs them to the drive circuits of the switching elements S2$# to turn on and of the switching elements S2$# constituting the second inverter device 22. Further, the control device 40 generates manipulation signals gc# and outputs them to the drive circuits of the switching elements Sc# to turn on and of the switching elements Sc# constituting the step-up converter device 30

The manipulation signals gcp, g1$p and g2$p are respectively in a complementary relation with the manipulation signals gcn, g1$n and g2$n. That is, the high-voltage side switching elements Scp, S1$p and S2$p and the corresponding low-voltage side switching elements Scn, S1$n and S2$n are respectively turned on alternately.

The interface 44 electrically insulates a high-voltage system including the high-voltage battery 50, the first and second inverter devices 12 and 22, the step-up converter device 30 and the first and second motor-generators 10 and 20 from a low-voltage system including the low-voltage battery 42 and the control device 40, while enabling communication between the high-voltage system and the low-voltage system. In this embodiment, the interface 44 includes photocouplers, and a reference voltage VstL of the low-voltage system is different from a reference voltage VstH of the high-voltage system. More specifically, the reference voltage VstH of the high-voltage system is set to the voltage of the negative terminal of the high-voltage battery 50, and the reference voltage VstL of the low-voltage system is set to the vehicle body voltage which is median between the voltages of the positive and negative terminals of the high-voltage battery 50.

Next, the structures of the drive circuits which drive the switching element Sc#, S1$# and S2$# and insulated power supplies which supply power to these drive circuits are explained. In this embodiment, the drive circuits of the upper-arm and lower-arm step-up switching elements Scp and Scn, the drive circuits of the first $-phase upper-arm switching elements S1$p, and the drive circuits of the second $-phase upper-arm switching elements S2$p are supplied with power from their insulated power supplies, respectively. On the other hand, the drive circuits of the first U-phase, V-phase and W-phase lower-arm switching elements S1Un, S1Wn and S1Wn, are supplied with power from a common insulated power supply, and the drive circuits of the second U-phase, V-phase and W-phase lower-arm switching elements S1Un, S1Vn and S1Wn are supplied with power from a common insulated power supply. The drive circuits and the common power supply of the first U-phase, V-phase and W-phase lower-arm switching elements S1Un, S1Wn and S1Wn are basically the same as those of the second U-phase, V-phase and W-phase lower-arm switching elements S2Un, S2Wn and S2Wn. Accordingly, the structures of the drive circuits of the first U-phase, V-phase and W-phase lower-arm switching elements S1un, S1vn and S1wn and the insulated power supply PS for supplying power to these drive circuits are explained with reference to FIG. 5.

Figure 5:
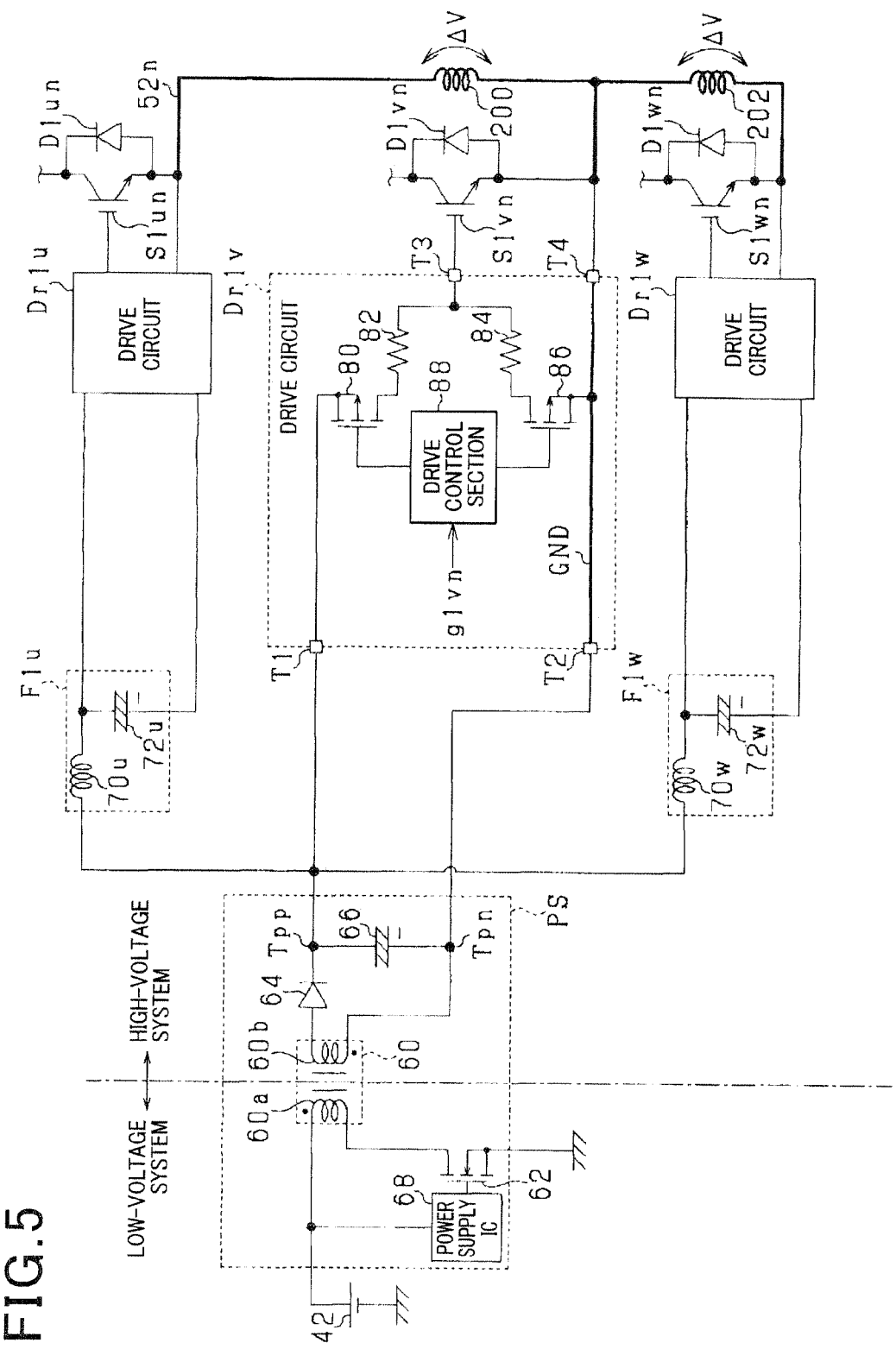
FIG. 5 is a diagram showing structures of an insulated power supply and drive circuits included in the power conversion apparatus according to the first embodiment of the invention.

As shown in FIG. 5, the insulated power supply PS is a flyback type switching power supply including a transformer 60 having a primary coil 60 and a secondary coil 60b, an a voltage control switching element (N-channel MOSFET in this embodiment) 62, a diode 64, a capacitor 66 and a power-supply IC 68. The positive and negative terminals of the low-voltage battery 42 are connected to each other through the primary coil 60a and the voltage control switching element 62. The both ends of the secondary coil 60b are connected to each other through a series connection of the diode 64 and the capacitor 66.

The connection node between the diode 64 and the capacitor 66 (this connection node being referred to as the positive terminal Tpp of the insulated power supply PS hereinafter) is connected to a first terminal T1 of the drive circuit corresponding to the first V-phase lower-arm switching element S1vn (this drive circuit being referred to as the first V-phase drive circuit Dr1v hereinafter) The connection node between the secondary coil 60b and the capacitor 60 (this node being referred to as the negative terminal Tpn of the insulated power supply PS hereinafter) is connected to a second terminal T2 of the first V-phase drive circuit Dr1v.

The positive terminal Tpp is connected to the drive circuit of the first U-phase lower-arm switching element S1un (this drive circuit being referred to as the U-phase drive circuit Dr1u hereinafter) through a first U-phase low pass filter F1u. The positive terminal Tpp is connected also to the drive circuit of the W-phase lower-arm switching element S1wn (this drive circuit being referred to as the first W-phase drive circuit Dr1w hereinafter) through a first W-phase low pass filter Fwu. It should be noted that no low pass filter is provided between the insulated power supply PS and the first V-phase drive circuit Dr1v.

The first U-phase low pass filter F1u is an LC filter including a first U-phase inductor 70u and a first U-phase capacitor 72u. The first W-phase low pass filter F1w is an LC filter including a first W-phase inductor 70w and a first W-phase capacitor 72w. In this embodiment, as each of the capacitor 66, the first U-phase capacitor 72u and the first W-phase capacitor 72w, an electrolytic capacitor is used.

The first U-phase and V-phase low pass filters F1u and F1w are provided for the purpose of suppressing variation of the voltages applied to the drive circuits from the insulated power supply PS due to variation of the ground voltages of the respective drive circuits caused by voltage drop in the negative side bus bar 52n through which a current is flowing. In FIG. 5, there are shown parasitic inductors 200 and 202 in the negative side bus bar 52n, which cause the voltage drop. Here, it is assumed that the inductance of the parasitic inductor 200 between the connection nodes of the negative side bus bar 52 with the first U-phase lower-arm switching element S1un and the first V-phase lower-arm switching element S1vn is the same as the inductance of the parasitic inductor 202 between the connection nodes of the negative side bus bar 52 with the first V-phase lower-arm switching element S1vn and the first W-phase lower-arm switching element S1wn. In this assumption, the value of the voltage drop $\Delta V$ by the parasitic inductor 200 is equal to the value of the voltage drop $\Delta V$ by the parasitic inductor 202.

The voltage control switching element 62 is turned on and off by the power supply IC 68. More specifically, the power supply IC 68 turns on and off the voltage control switching element 62 to control the output voltage of the insulated power supply PS at a target voltage (15 V, for example).

Next, the drive circuits Dr1u, Dr1v and Dr1w are explained in detail. Here, it is assumed that the drive circuits of the switching element Sc#, S1$# and 52$# are the same in structure. Accordingly, the explanation is given only for the first V-phase drive circuit Dr1v.

The first terminal T1 of the first V-phase drive circuit Dr1v is connected to the open/close control terminal (gate) of the first V-phase lower-arm switching element S1vn through a P-channel MOSFET (hereinafter, the charge switching element 80), a charge resistor 82 and a third terminal T3 of the first V-phase drive circuit Dr1v. The gate of the first V-phase lower-arm switching element S1vn is connected to the output terminal (emitter) of the first V-phase lower-arm switching element S1vn through the third terminal T3, a discharge resistor 84 and an N-channel MOSFET (hereinafter, the discharge switching element 86) and a fourth terminal T4 of the first V-phase drive circuit Dr1v.

The second terminal T2 is connected to the fourth terminal T4 within the first V-phase drive circuit Dr1v. In FIG. 5, an electrical path which short-circuits the second and fourth terminals T2 and T4 is indicated as ground GND of the first V-phase drive circuit Dr1v. That is, the ground voltage of the first V-phase drive circuit Dr1v is the emitter voltage of the first V-phase lower-arm switching element S1vn.

A drive control section 88 provided in the first V-phase drive circuit Dr1 drives first V-phase lower-arm switching element S1vn by performing a charging process and a discharging process alternately using the charge switching element 80 and the discharge switching element 86 in accordance with the manipulation signal g1vn received from the control device 40 through the interface 44. The charging process is a process in which the discharge switching element 86 is turned off and the charge switching element 80 is turned on when the manipulation signal g1vn represents an on-command. The discharging process is a process in which the discharge switching element 86 is turned on and the charge switching element 80 is turned off when the manipulation signal g1vn represents an off-command.

In this embodiment, the negative terminal Tpn of the insulated power supply PS is connected to the ground GND of the V-phase drive circuit Dr1v. This configuration is for reducing variation of the ground voltages of the drive circuits Dr1u, Dr1v and Dr1w on the lower-arm side constituting the first inverter device 12. Next, the feature of this configuration is explained in contrast with a related art.

Figure 6:
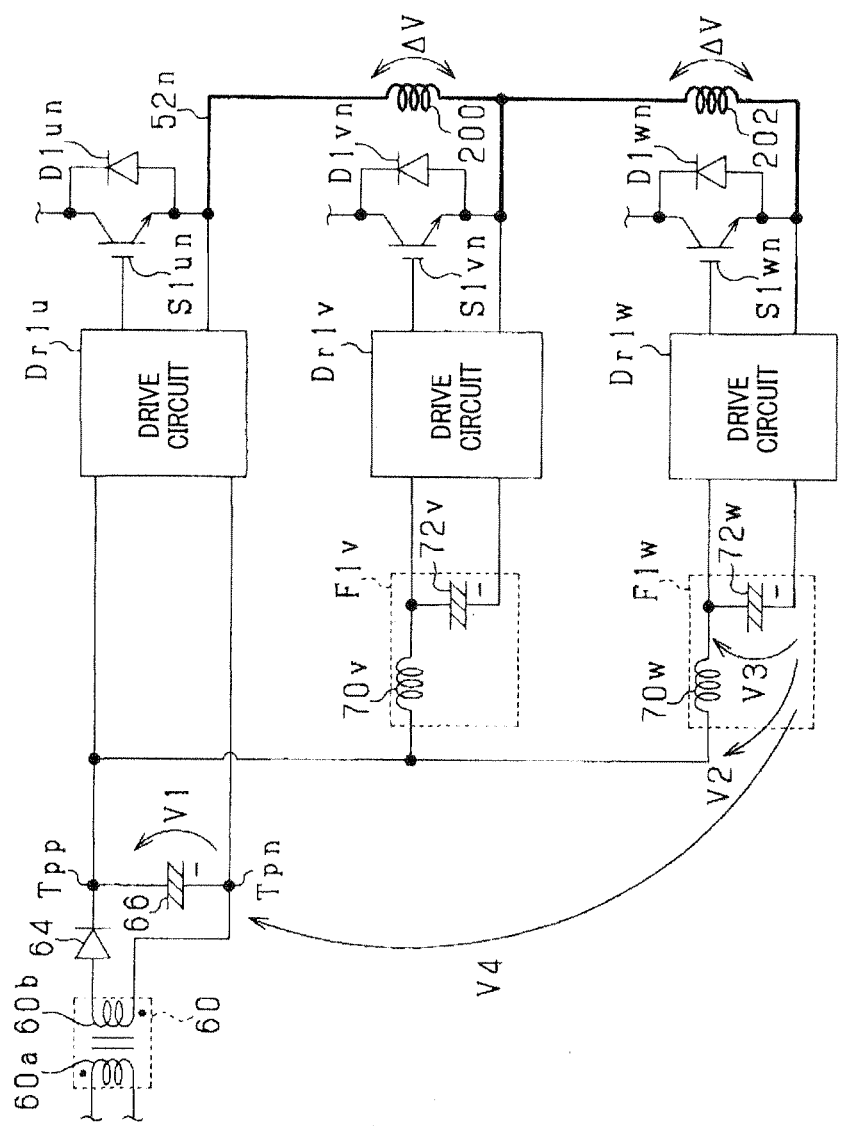
FIG. 6 is a diagram showing structures of an insulated power supply and drive circuits of a related art.

FIG. 6 is a diagram showing structures of an insulated power supply and a drive circuit of a related art. In FIG. 6, elements or components which are the same as those shown in FIG. 5 are indicated by the same reference numerals or characters. The low-voltage system is omitted from FIG. 6.

As shown in FIG. 6, the related art includes no LC filter between the insulated power supply PS and the first U-phase drive circuit Dr1u. The negative terminal Tpn of the insulated power supply PS is connected to the ground GND of the first U-phase drive circuit Dr1u. A V-phase low pass filter F1v is disposed between the insulated power supply PS and the first V-phase drive circuit Dr1v. The V-phase low pass filter F1v is an LC filter including a first V-phase inductor 70v and a first V-phase capacitor 72v.

In this related art, when a current flows from the first W-phase lower-arm switching element S1wn to the capacitor 32 through the negative side bus bar 52n, a voltage drop of 2x$\Delta$V may occur between the connection nodes of the negative side bus bar 52n with the first U-phase switching element S1un and the first W-phase lower-arm switching element S1wn. In this case, the ground voltage of the first V-phase drive circuit Dr1v is higher by $\Delta$V than the ground voltage of the first U-phase drive circuit Dr1u. Likewise, the ground voltage of the first W-phase drive circuit Dr1w is higher by 2$\Delta$V than the ground voltage of the first U-phase drive circuit Dr1u.

Figure 7:
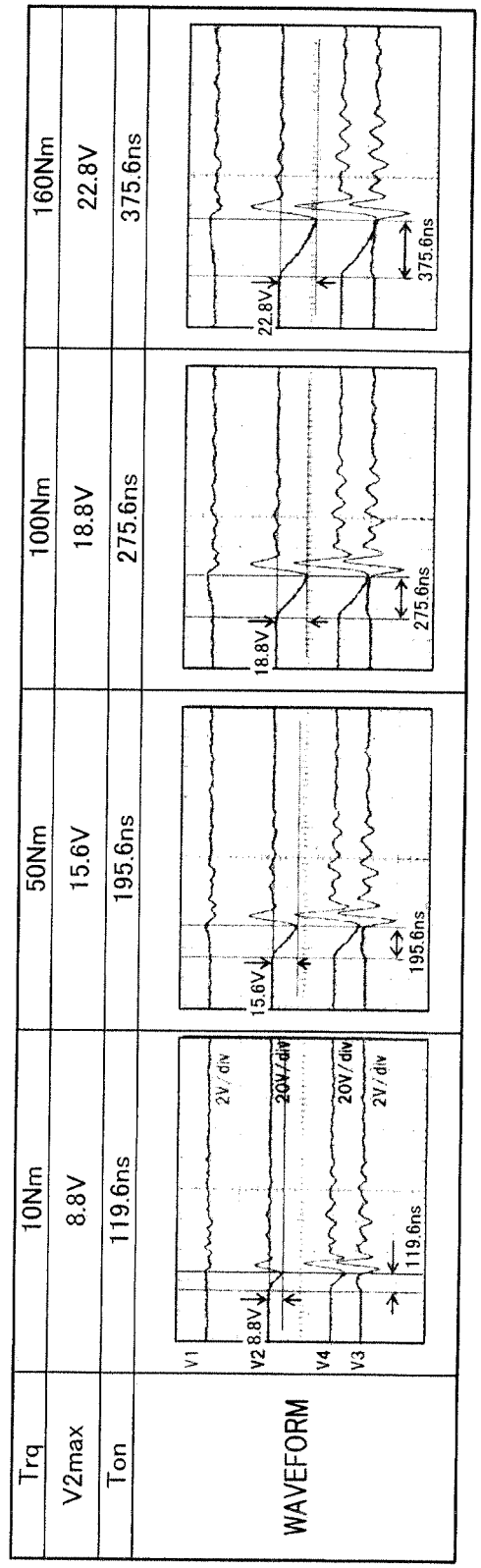
FIG. 7 is a diagram explaining effects of low-pass filters of the related art.

Such variations of the ground voltages depend on the operation state of the first motor-generator 10. FIG. 7 shows transitions of the ground voltages of the drive circuits for various different values of the torque Trq of the first motor-generator 10. In FIG. 7, the voltage of the positive terminal Tpp relative to negative terminal Tpn of the insulated power supply PS shown in FIG. 6 is indicated as V1, and the voltage of the first W-phase inductor 70w on the side of the positive terminal Tpp relative to the ground voltage of the first W-phase drive circuit Dr1w is indicated as V2. Further, the voltage of the connection node between the first W-phase inductor 70w and the first W-phase capacitor 72w relative to the ground voltage of the first W-phase drive circuit Dr1w is indicated as V3, and the voltage of the negative terminal Tpn relative to the ground voltage of the first W-phase drive circuit Dr1w is indicated as V4. Incidentally, in FIG. 7, the vertical axis scale (20 V/div) for the V2 and V4 is larger than the vertical axis scale (2 V/div) for the V1 and V3.

As shown in FIG. 7, the current increases with the increase of the torque Trq of the first motor-generator 10. Since the voltage drop in the negative side bus bar 52n increases with the increase of the current, variation of the V4 as a parameter indicative of variation of the ground voltage of the drive circuit Dr1w increases with the increase of the torque Trq of the first motor-generator 10. As a result, the V3 as a parameter indicative of variation of the ground voltage of the drive circuit Dr1w increases with the increase of the torque Trq of the first motor-generator 10.

Figure 8:
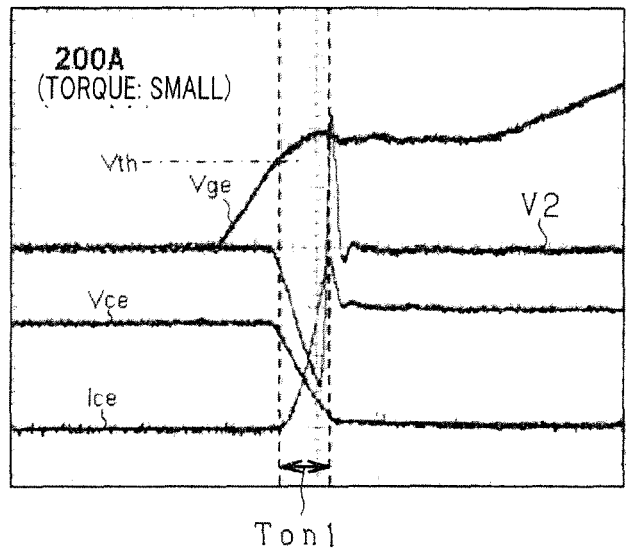
FIG. 8 is a diagram explaining an example of definition of a turn-on time.
Figure 9:
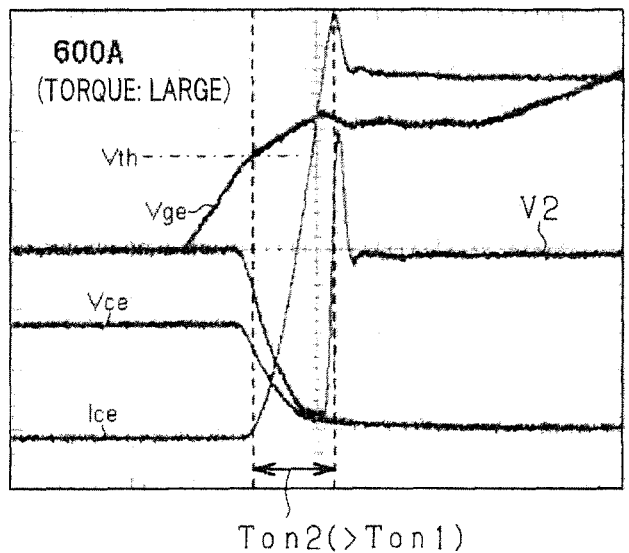
FIG. 9 is a diagram explaining another example of definition of the turn-on time.

Incidentally, as shown in FIGS. 8 and 9, the turn-on time Ton shown in FIG. 7 is a time from when the gate voltage Vge has reached a threshold voltage Vth to when the collector current Ice peaks. FIG. 8 and FIG. 9 show transitions of the gate voltage Vge, collector-emitter voltage Vice, the collector current Ice and the V2 when the torque Trq is large and small, respectively. As seen from these figures, the turn-on time Ton becomes long with the increase of the torque Trq of the first motor-generator 10 (Ton2>Ton1).

Returning to FIG. 6, since the amount of variation of the ground voltage of the first W-phase drive circuit Dr1w is twice that of the first V-phase drive circuit Dr1v, it is necessary for the first W-phase low pass filter F1w to have a filtering capacity greater than that of the first V-phase low pass filter F1v. Accordingly, it is necessary to increase the inductance of the first W-phase inductor 70w to enable lowering the resonance frequency of the first W-phase low pass filter F1w, for example. However, increasing the inductance to increase the filtering capacity causes the size of the first W-phase inductor 70w to increase, as a result of which the size of the first W-phase low pass filter F1w is increased.

Figure 10:
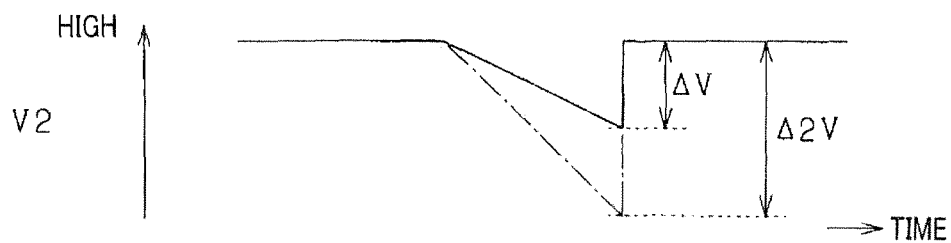
FIG. 10 is a diagram explaining advantageous effects of the power conversion apparatus according to the first embodiment of the invention.

To cope with this problem, this embodiment employs the structure shown in FIG. 5. That is, in this embodiment, of the three connection nodes of the negative side bus bar 52n with the first U-phase, V-phase and W-phase lower-arm switching element S1un, S1vn and S1wn, the middle one, that is, the connection node between the negative side bus bar 52 and the first V-phase lower-arm switching element S1vn is connected to the negative terminal Tpn of the insulated power supply PS. As shown in FIG. 10, according to this configuration, it is possible to reduce the amount of variation (V2 shown in FIG. 6) of the ground voltage of the first W-phase drive circuit Dr1w from 2$\Delta$W indicated by the chain line to $\Delta$V indicated by the solid line. Hence, this configuration allows reduction of the filtering capacity of the first W-phase low pass filter F1w.

That is, according to this embodiment, the low pass filter of the first inverter device 12 may have a small filtering capacity. This makes it possible to reduce the size and cost of the low pass filter of the first inverter device 12.

The above description on the first inverter device 12 also applies to the second inverter device 22.

Second Embodiment

Next, a second embodiment is described with a focus on differences with the first embodiment.

In the second embodiment, the first U-phase, V-phase and W-phase lower-arm switching elements S1Un, S1Vn and S1Wn and the second U-phase, V-phase and W-phase lower-arm switching elements S2Un, S2Vn and S2Wn are supplied with power by a common insulated power source. Accordingly, the connection destination of the negative terminal Tpn of insulated power supply PS is changed.

Figure 11:
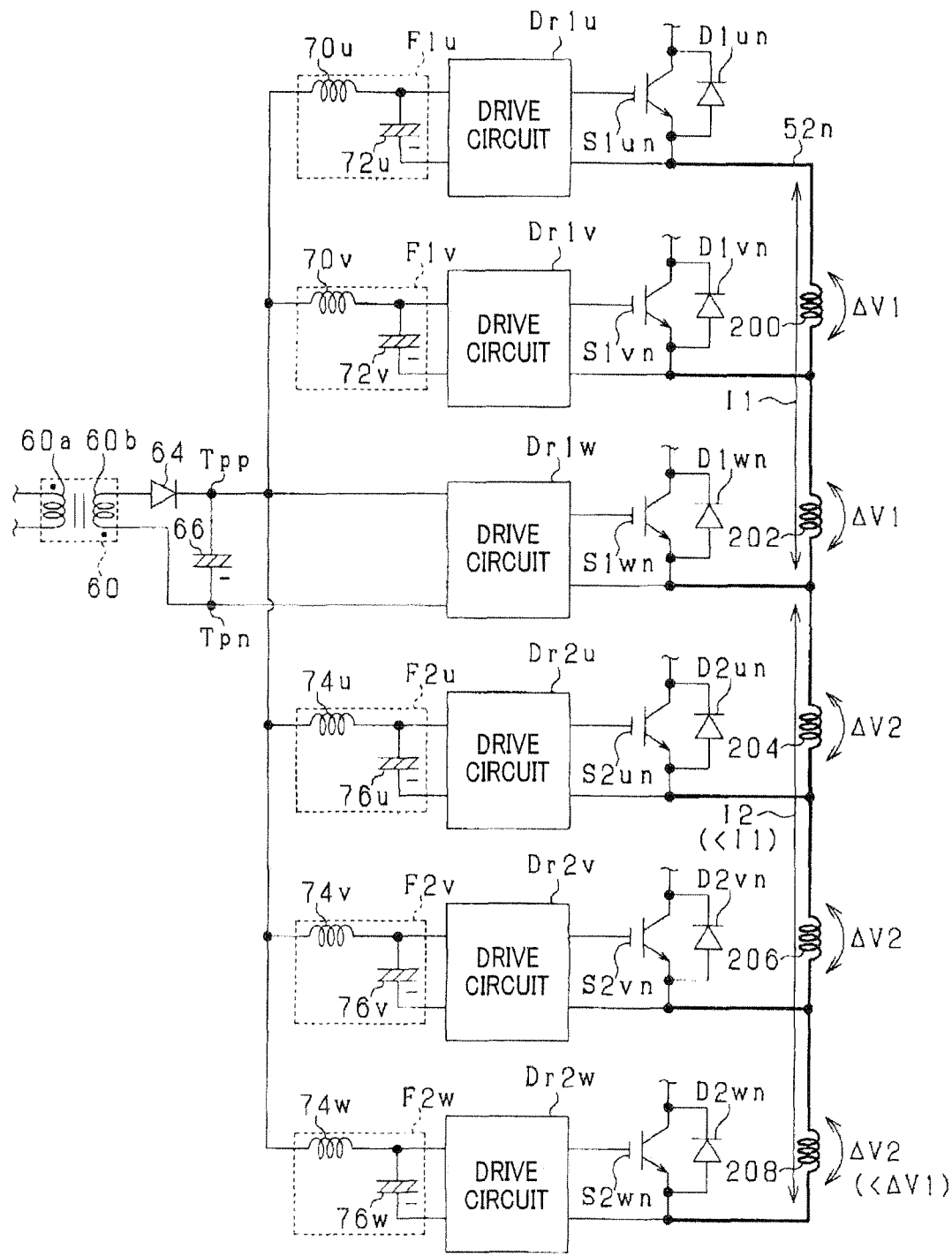
FIG. 11 is a diagram showing structures of an insulated power supply and drive circuits included in a power conversion apparatus according to a second embodiment of the invention.

FIG. 11 shows the structure of the insulated power supply and the drive circuits of this embodiment. In FIG. 11, elements or components which are the same as those shown in FIG. 5 are indicated by the same reference numerals or characters. The low-voltage system is omitted from FIG. 11.

As shown in FIG. 11, in this embodiment, of the three connection nodes of the negative side bus bar 52n with the first U-phase, V-phase and W-phase lower-arm switching element S1un, S1vn and S1wn, the one which adjoins the connection node between the negative side bus bar 52 and the second U-phase lower-arm switching element S2un (that is, the connection node between the negative side bus bar 52n and the first W-phase lower-arm switching element S1wn) is connected to the negative terminal Tpn of the insulated power supply PS.

Incidentally, in FIG. 11, the second U-phase, V-phase and W-phase drive circuits Dr2u, Dr2v and Dr2w of the second U-phase, V-phase and W-phase lower-arm switching elements S2un, S2vn and S2wn are shown. Between these drive circuit Dr2u, Dr2v and Dr2w and the insulated power supply PS, second U-phase, V-phase and W-phase low pass filters F2u, F2v and F2w are interposed. These low pass filters F2u, F2v and F2w are LC filters respectively including second U-phase, V-phase and W-phase inductors 74$u$, 74$v$ and 74$w$ and second U-phase, V-phase and W-phase capacitors 76$u$, 76$v$ and 76$w$.

In FIG. 11, the reference numerals 200, 202, 204, 206 and 208 represent parasitic inductors of the negative side bus bar 52$n$. Here, it is assumed that the inductances between respective adjacent two of the six connection nodes of the negative side bus bar 52$n$ with the first U-phase, V-phase and W-phase lower-arm switching elements S1un, S1vn and S1wn and the second U-phase, V-phase and W-phase lower-arm switching elements S2un, S2vn and S2wn are the same as one another.

In this embodiment, the output current I1 of the first inverter device 12 is set greater than the output current I2 of the second inverter device 22. This is because the maximum output power of the first motor-generator 10 as the vehicle main engine is greater than that of the second motor-generator 20. According to this setting, the voltage drop amount of $\Delta V1$ between respective adjacent two of the three connection nodes of the negative side bus bar 52$n$ with the first U-phase, V-phase and W-phase lower-arm switching elements S1un, S1vn and S1wn becomes greater than the voltage drop amount of $\Delta V2$ between respective adjacent two of the four connection nodes of the negative side bus bar 52$n$ with first W-phase lower-arm switching element S1wn and the second U-phase, V-phase and W-phase lower-arm switching elements S2un, S2vn and S2wn.

Accordingly, in this embodiment, the connection destination of the negative terminal Tpn of insulated power supply PS is set to the connection node between the first W-phase lower-arm switching element S1wn and the negative side bus bar 52$n$. According to the above configuration, it is possible to reduce the difference ($2\Delta V1-3\Delta W2$) between the voltage drop amount between the connection node connected with the negative terminal Tpn and one of the two end-side connection nodes of the six connection nodes of the negative side bus bar 52$n$ with the switching elements S1un, S1vn, S1wn, S2un, S2vn and S2wn (that is, the connection nodes of the negative side bus bar 52$n$ with the first U-phase lower-arm switching element S1un and the second W-phase lower-arm switching element S2wn) and the voltage drop amount between the connection node connected with the negative terminal Tpn and the other of the two end-side connection nodes. Hence, according to this embodiment, the low pass filters of the first and second inverter devices 12 and 22 may have a small filtering capacity. This makes it possible to reduce the size and cost of these low pass filters.

Third Embodiment

Next, a third embodiment is described with a focus on differences with the second embodiment.

In the third embodiment, the drive circuits of the upper-arm and lower-arm step-up switching elements Sop and Son and the second U-phase, V-phase and W-phase lower-arm switching elements S1Un, S1Vn and S1Wn are supplied with a common insulated power supply. Accordingly, the connection destination of the negative terminal Tpn of the insulated power supply PS is changed.

Figure 12:
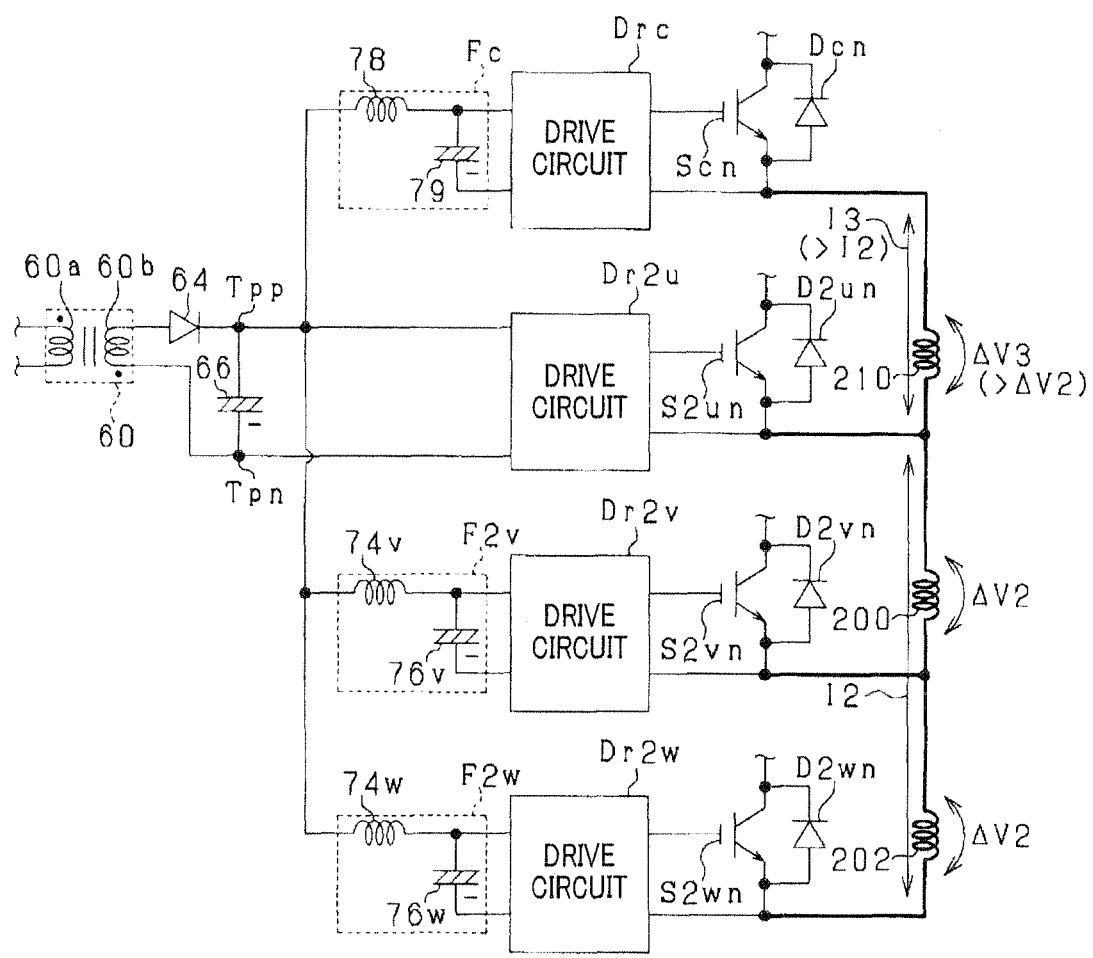
FIG. 12 is a diagram showing structures of an insulated power supply and drive circuits included in a power conversion apparatus according to a third embodiment of the invention.

FIG. 12 shows the structures of the insulated power supply and the drive circuits of this embodiment. In FIG. 12, elements or components which are the same as those shown in FIG. 11 are indicated by the same reference numerals or characters.

The low-voltage system is omitted from FIG. 12.

As shown in FIG. 12, of the three connection nodes of the negative side bus bar 52$n$ with the second U-phase, V-phase and W-phase lower-arm switching elements S2un, S2vn and S2wn, the one adjoining the connection node between the lower-arm step-up switching element Scn and the negative side bus bar 52$n$ (that is, the connection node between the negative side bus bar 52$n$ and the second U-phase switching element S2un) is connected to the negative terminal Tpn of insulated power supply PS.

In FIG. 12, the step-up drive circuit Drc of the lower-arm step-up switching element Scn is shown. Between the step-up drive circuit Drct and the insulated power supply PS, a $ low pass filter Fc is interposed. The step-up-phase low pass filter Fc is an LC filter including an inductor 78 and a capacitor 79.

In FIG. 12, the reference numerals 200, 202 and 210 represent parasitic inductors of the negative side bus bar 52$n$. Here, it is assumed that the inductances of respective adjacent two of the four connection nodes of the negative side bus bar 52$n$ with the lower-arm step-up switching element Scn and the second U-phase, V-phase and W-phase lower-arm switching elements S2un, S2vn and S2wn are the same as one another.

In this embodiment, the output current I3 of the step-up converter device 30 is set greater than the output current I2 of the second inverter device 22. This is because the output current of the step-up converter device 30 is distributed to both the first inverter device 12 and the second inverter device 22. According to this setting, the voltage drop amount of $\Delta V3$ ($\Delta V3>\Delta V1$) between the connection nodes of the negative side bus bar 52$n$ with the lower-arm step-up switching element Scn and second U-phase switching element S2un becomes greater than the voltage drop amount of $\Delta V2$ between respective adjacent two of the three connection nodes of the negative side bus bar 52$n$ with the second U-phase, V-phase and W-phase lower-arm switching elements S2un, S2vn and S2wn.

Accordingly, in this embodiment, the connection destination of the negative terminal Tpn of insulated power supply PS is set to the connection node between the second U-phase lower-arm switching element S2un and the negative side bus bar 52$n$. Hence, according to this embodiment, the low pass filters of the step-up converter device 30 and the second inverter device 22 may have a small filtering capacity. This makes it possible to reduce the size and cost of these low pass filters.

Fourth Embodiment

Next, a fourth embodiment is described with a focus on differences with the first embodiment.

Figure 13:
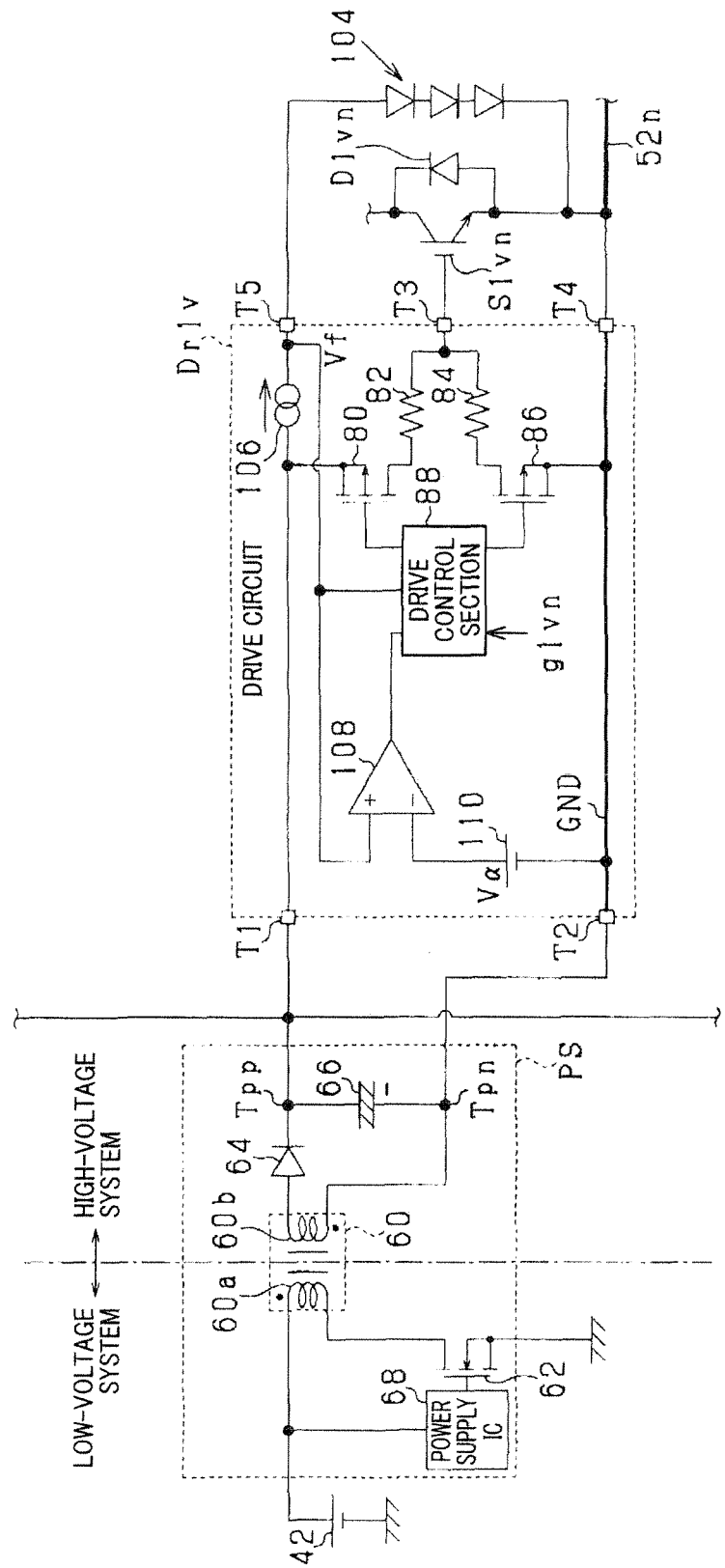
FIG. 13 is a diagram showing structures of an insulated power supply and drive circuits included in a power conversion apparatus according to a fourth embodiment of the invention.
Figure 14:
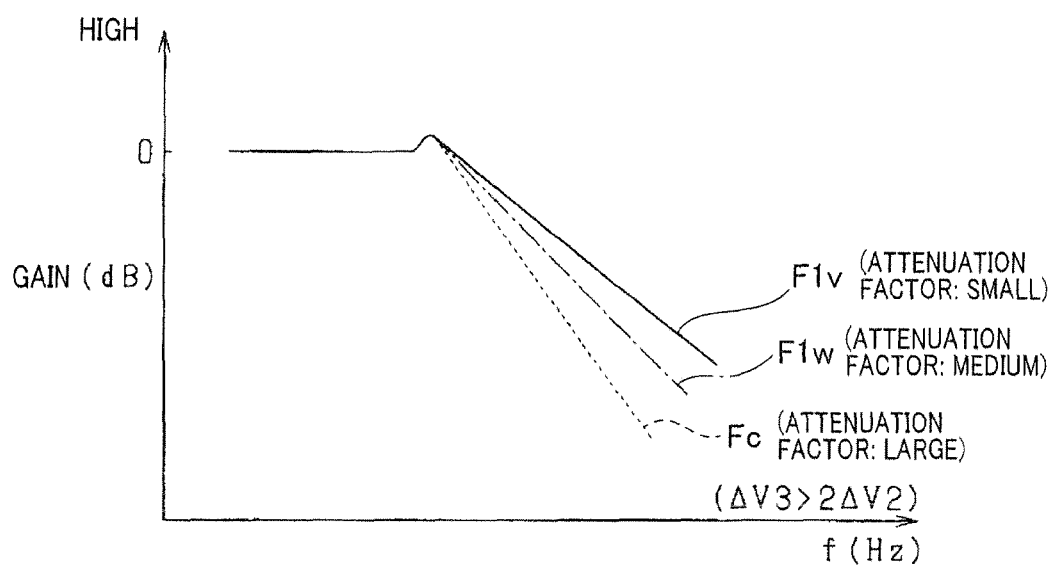
FIG. 14 is a diagram showing the frequency transfer function of LC filters included in a power conversion apparatus according to a fifth embodiment of the invention.

FIG. 13 shows the structure of the insulated power supply and the drive circuits of this embodiment. In FIG. 13, elements or components which are the same as those shown in FIG. 5 are indicated by the same reference numerals or characters.

In this embodiment, the first V-phase lower-arm switching element S1vn is provided with a temperature-sensing diode 104. The temperature-sensing diode 104 is for sensing the temperature of the first V-phase lower-arm switching element S1vn (the "element temperature" hereinafter). To accurately sense the element temperature by the temperature-sensing diode 104, the connection destination of the negative terminal Tpn of insulated power supply PS is set to the ground GND of the first V-phase drive circuit Dr1v.

More specifically, the cathode of the temperature-sensing diode 104 is connected to the emitter of the first V-phase lower-arm switching element S1vn, and the anode of the temperature-sensing diode 104 is connected to a constant-current power supply 106. The constant-current power supply 106 generates a constant current to be supplied to the temperature-sensing diode 104. According to this connection configuration, the temperature-sensing diode 104 outputs a voltage Vf reflecting the actual element temperature. Incidentally, the output voltage Vf of the temperature-sensing diode 104 is in a negative correlation with the actual element temperature.

The connection node between the temperature-sensing diode 104 and the constant-current power supply 106 is connected to the non-inverting input terminal of a comparator 108. The inverting input terminal of the comparator 108 is connected with a power supply 110. In this embodiment, the terminal voltage Vα of the power supply 110 is set to the upper limit of the range the output voltage Vf in which the first V-phase lower-arm switching element S1vn can operate.

The drive control section 88 performs a local shutdown process in which if it is determined that the output voltage Vf will fall below a specified voltage causing the logic level of the output signal of the comparator 108 to become L (low level), the first V-phase lower-arm switching element S1vn is inhibited from operating. According to this process, since the first V-phase lower-arm switching element S1vn can be turned off promptly, it is possible to prevent the reliability of the first V-phase lower-arm switching element S1vn from being reduced substantially.

Incidentally, the drive control section 88 performs also a process for directly receiving the output voltage Vf of the temperature-sensing diode 104, and sending a signal indicating the element temperature to the control device 40 through the interface 44.

As described above, in this embodiment, the first V-phase drive circuit Dr1v connected with the negative terminal Tpn of insulated power supply PS is provided with the constant-current power supply 106 for supplying a constant current to the temperature-sensing diode 104. Since the input voltage of the first V-phase drive circuit Dr1v connected with the negative terminal Tpn of insulated power supply PS is stable, the output current of the constant-current power supply 106 can be adjusted with a high degree of precision. Hence, according to this embodiment, the accuracy of detection of the element sensor by the temperature-sensing diode 104 can be made very high.

Fifth Embodiment

Next, a fifth embodiment is described with a focus on differences with the third embodiment.

In the fifth embodiment, each of the low pass filters Fc, F2v and F2w is configured to increase the attenuation factor (for example, a parameter represented as "−20 dB/dec") with the increase of the voltage drop amount between each of the connection nodes of the negative side bus bar 52n with the switching elements Scn, S2vn and S2wn and the connection node between the negative terminal Tpn of insulated power supply PS and the negative side bus bar 52n. In this embodiment, the output current I3 of the step-up converter device 30 is greater than the output current I2 of the 2nd inverter device 22, and the inductances of the parasitic inductor 200, 202 and 210 are the same as one another. Hence, here, it is assumed that the relationship of $\Delta V3-2\Delta V2$ holds in the structure shown in FIG. 12. Accordingly, the attenuation factor of the step-up-phase low pass filter Fc is set greater than that of the first W-phase low pass filter F1w. Further, the attenuation factor of the first W-phase low pass filter F1w is set greater than the first V-phase low pass filter F1v. As a result, the gain of the step-up-phase low pass filter Fc becomes smaller than that of the first W-phase low pass filter F1w, and the gain of the first W-phase low pass filter F1w becomes smaller than that of the first V-phase low pass filter F1y.

As described above, in this embodiment, the attenuation factors of the low pass filters are determined depending on the voltage drop amount of the negative side bus bar 52n, which reflects variations of the ground voltages of the drive circuits, so that the variations of the ground voltages can be reduced more effectively.

Other Embodiments

It is a matter of course that various modifications can be made to the above described embodiments as described below.

The insulated power supply PS may supply power to all of the six switching elements on the low-voltage side. Also in this case, variations of the input voltages of the respective drive circuits can be reduced by connecting the negative terminal Tpn of insulated power supply PS to the connection node between the negative side bus bar 52n and the first W-phase lower-arm switching element S1wn.

In the first embodiment, the inductance of the parasitic inductor 200 between the connection nodes of the negative side bus bar 52n with the first U-phase lower-arm switching element S1un and the first V-phase lower-arm switching element S1vn may be different from the inductance of the parasitic inductor 202 of the parasitic inductor 200 between the connection nodes of the negative side bus bar 52n with the first V-phase lower-arm switching element S1vn and the first W-phase lower-arm switching element S1wn.

In the second embodiment, if the output current I1 of the first inverter device 12 and the output current I2 of the second inverter device 22 are the same as each other, each of the low pass filters F1u, F1y, F2u, F2v and F2w is configured such that the attenuation factor increases with the increase of the inductance between the corresponding one of the connection nodes of the negative side bus bar 52 with the switching elements S1un, S1vn, S2un, S2vn and S2wn.

The temperature sensor is not limited to a temperature-sensing diode. For example, it may be a thermistor.

The power conversion apparatuses according to the above described embodiments of the invention can be used for supplying voltage to other than an electric rotating machine.

The drive circuits may be supplied with power from other than an insulated power supply.

The negative side bus bar does not necessarily have to have an elongated plate shape. For example, it may have a bent plate shape, or a bar shape.

The high-voltage and low-voltage side switching elements are not limited to IGBTs. For example, they may be MOSFETs.

The low pass filters are not limited to LC filters as shown in FIG. 2. For example, they may be pi-type filters, T-type filters or RC filters.

The DC power supply is not limited to a step-up converter device. For example, the high-voltage battery 50 may be used as the DC power supply when the power conversion apparatus cannot be provided with the step-up converter device 30.

The above explained preferred embodiments are exemplary of the invention of the present application which is described solely by the claims appended below. It should be understood that modifications of the preferred embodiments may be made as would occur to one of skill in the art.

What is claimed is:

1. A power conversion apparatus comprising:
series connections each including a low-voltage side switching element having first and second ends and a high-voltage side switching element connected to the first end of the low-voltage side switching element;
a negative side bus to which the second ends of the low-voltage side switching elements are connected;
drive circuits provided respectively for the low-voltage side switching elements for respectively driving the low-voltage side switching elements; and
a power supply connected to the drive circuits;
wherein
a ground voltage of each of the drive circuits is a voltage of the second end of a corresponding one of the low-voltage side switching elements,
the negative side bus has an elongated shape,
the low-voltage side switching elements are arranged along a direction in which the negative side bus extends to be connected to the negative side bus,
a negative terminal of the power supply is connected to one of connection nodes of the negative side bus with the low-voltage side switching elements except the connection node closest to an extreme end of the negative side bus, and
a low pass filter is interposed between the power supply and each of the drive circuits except the drive circuit corresponding to the low-voltage side switching element connected with the negative terminal of the power supply.

2. The power conversion apparatus according to claim 1, wherein
the power conversion apparatus operates as at least one three-phase inverter device that converts a DC voltage to an AC voltage, and applies the AC voltage to a voltage supply object from connection nodes between the high-voltage side switching elements and the low-voltage side switching elements by manipulating the high-voltage side and low-voltage side switching elements,
the drive circuits are provided respectively for the low-voltage side switching elements which partially constitute the three-phase inverter device,
the power supply is connected to the drive circuits provided respectively for the low-voltage side switching elements which partially constitute the three-phase inverter device, and
the negative terminal of the power supply is connected to one of the connection nodes of the negative side bus with the low-voltage side switching elements which partially constitute the three-phase inverter device except the connection node closest to an extreme end of the negative side bus.

3. The power conversion apparatus according to claim 2, wherein the power conversion apparatus operates as a single three-phase inverter, the negative terminal of the power supply being connected to a middle one of the connection nodes of the negative side bus with the low-voltage side switching elements which partially constitute the three-phase inverter device.

4. The power conversion apparatus according to claim 2, wherein
the power conversion apparatus operates as a first three-phase inverter device and a second three-phase inverter device,
the first three-phase inverter device converts the DC voltage to a first AC voltage, and applies the first AC voltage to a first voltage supply object from connection nodes between first upper-arm switching elements as part of the high-voltage side switching elements and first lower-arm switching elements as part of the low-voltage side switching elements by manipulating the first upper-arm switching elements and the first lower-arm switching elements, and
the second three-phase inverter device converts the DC voltage to a second AC voltage, and applies the second AC voltage to a second voltage supply object from connection nodes between second upper-arm switching elements as part of the high-voltage side switching elements and second lower-arm switching elements as part of the low-voltage side switching element by manipulating the second upper-arm switching elements and the second lower arm switching elements,
an output current of the first three-phase inverter device being greater than an output current of the second three-phase inverter device,
the first lower-arm switching elements and the second lower-arm switching elements being arranged in this order along the direction in which the negative side bus extends to be connected to the negative side bus, and
the negative terminal of the power supply is connected to one of the connection nodes of the negative side bus with the first lower-arm switching elements which adjoins the connection nodes of the negative side bus with the second lower-arm switching elements.

5. The power conversion apparatus according to claim 2, wherein
the power conversion apparatus operates as a three-phase inverter device and a step-up converter device, the three-phase inverter device converts the DC voltage to the AC voltage and applies the AC voltage to the voltage supply object from connection nodes between upper-arm switching elements as part of the high-voltage side switching elements and lower-arm switching elements as part of the low-voltage side switching elements by manipulating the upper-arm switching elements and the lower-arm switching elements, and
the step-up converter device steps up an output voltage of a DC power supply to generate the DC voltage to be supplied to the three-phase inverter device by manipulating upper-arm step-up switching elements as part of the high-voltage side switching elements and lower-arm step-up switching elements as part of the low-voltage side switching elements,
an output current of the step-up converter device being greater than an output current of the three-phase inverter device,
the lower-arm step-up switching elements and the lower-arm switching elements being arranged in this order along a direction in which the negative side bus extends to be connected to the negative side bus,
the negative terminal of the power supply being connected to one of the connection nodes of the negative side bus with the lower-arm switching elements which adjoins the connection nodes of the negative side bus with the lower-arm step-up switching elements.

6. The power conversion apparatus according to claim 1, further comprising a temperature sensor for sensing temperature of one of the low-voltage side switching elements, which uses as a ground thereof a connection node between the negative side bus and the negative terminal of the power supply and is connected with the negative terminal of the power supply.

7. The power conversion apparatus according to claim 1, wherein each of the low pass filters is configured to increase attenuation factor thereof with increase of an amount of voltage drop between the connection node between a corresponding one of the low-voltage side switching element and the negative side bus and the connection node between the negative side bus and the negative terminal of the power supply.

* * * * *